United States Patent
Rehani et al.

(10) Patent No.: US 7,305,634 B2
(45) Date of Patent: Dec. 4, 2007

(54) METHOD TO SELECTIVELY IDENTIFY AT RISK DIE BASED ON LOCATION WITHIN THE RETICLE

(75) Inventors: Manu Rehani, Portland, OR (US); Kevin Cota, Portland, OR (US); Robert Madge, Portland, OR (US)

(73) Assignee: LSI Corporation, Milpitas, CA (US)

( * ) Notice: Subject to any disclaimer, the term of this patent is extended or adjusted under 35 U.S.C. 154(b) by 59 days.

(21) Appl. No.: 10/996,074

(22) Filed: Nov. 23, 2004

(65) Prior Publication Data

US 2006/0109462 A1    May 25, 2006

(51) Int. Cl.
*G06F 17/50* (2006.01)
(52) U.S. Cl. .................................. 716/4; 716/5
(58) Field of Classification Search ........... 716/4–5, 716/8, 19–21; 700/121, 115; 702/58, 81, 702/120, 123; 382/141, 149; 356/401; 430/5, 430/22, 30
See application file for complete search history.

(56) References Cited

U.S. PATENT DOCUMENTS

| | | | |
|---|---|---|---|
| 6,016,391 A * | 1/2000 | Facchini et al. | 716/21 |
| 6,128,070 A * | 10/2000 | Peng | 355/53 |
| 6,374,398 B1 * | 4/2002 | Magee et al. | 716/21 |
| 6,405,096 B1 * | 6/2002 | Toprac et al. | 700/121 |
| 6,477,685 B1 * | 11/2002 | Lovelace | 716/4 |
| 6,512,985 B1 * | 1/2003 | Whitefield et al. | 702/81 |
| 6,522,940 B1 * | 2/2003 | Erck et al. | 700/121 |
| 6,735,492 B2 * | 5/2004 | Conrad et al. | 700/121 |
| 6,880,140 B2 * | 4/2005 | Gonzales et al. | 716/4 |
| 6,885,950 B2 * | 4/2005 | Mitsutake et al. | 702/58 |
| 6,980,917 B2 * | 12/2005 | Ward et al. | 702/120 |
| 2004/0126004 A1 * | 7/2004 | Kikuchi | 382/141 |
| 2005/0090925 A1 * | 4/2005 | Albrecht et al. | 700/121 |
| 2005/0166171 A1 * | 7/2005 | Bartov | 716/19 |
| 2006/0031801 A1 * | 2/2006 | McIntyre et al. | 716/8 |
| 2006/0033916 A1 * | 2/2006 | Sugihara et al. | 356/401 |

* cited by examiner

*Primary Examiner*—Vuthe Siek
(74) *Attorney, Agent, or Firm*—Trexler, Bushnell, Giangiorgi & Blackstone

(57) ABSTRACT

A method and system of selectively identifying at risk die based on location within the reticle. Reticle and stepping information is stored in a database. All reticle shots in a wafer and in a lot are overlaid on top of each other. The reticle and stepping information is used to calculate pass/fail or specific bin yield of reticle fields. It is determined if the yield of some reticle locations is below a statistical measure by a pre-determined threshold, and if so, all the die in that location are downgraded. The statistical value to compare against does not have to be based on the reticle alone. It can be a wafer of lot level statistic. The process can be applied at a lot or wafer level, or both.

16 Claims, 5 Drawing Sheets

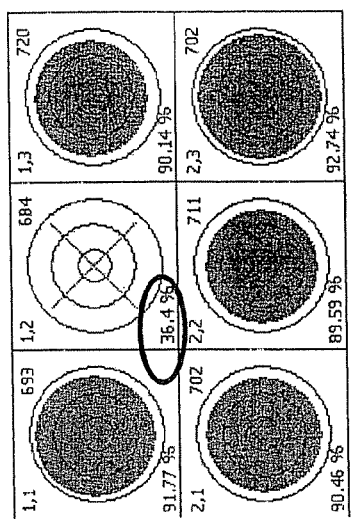
Figure 5
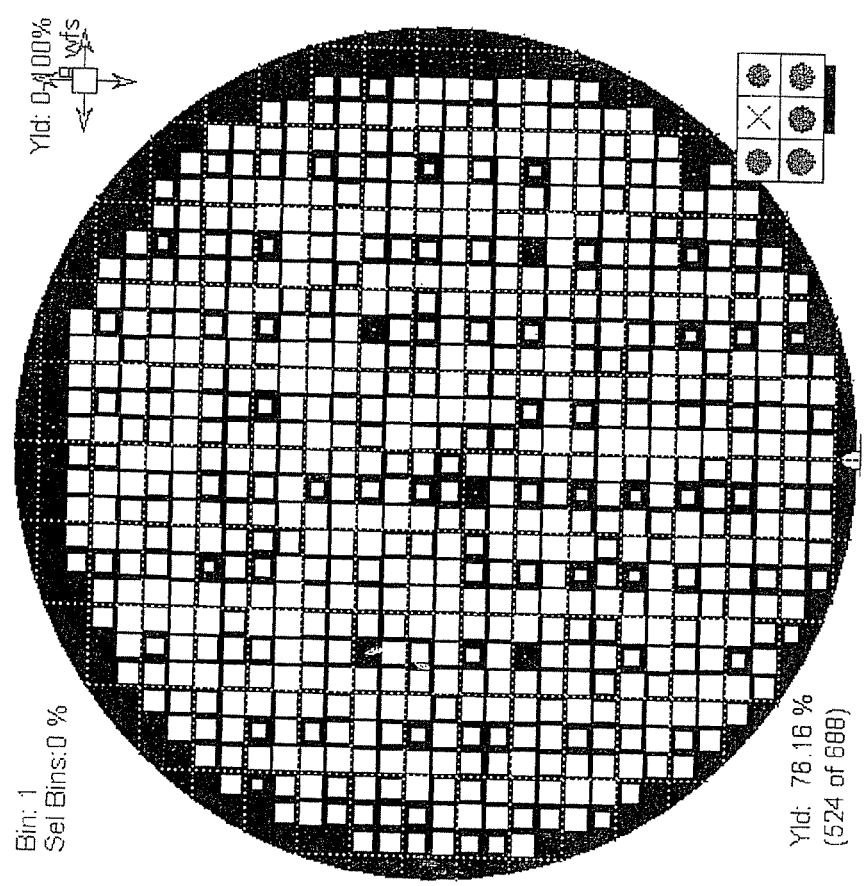
Figure 6
Figure 4

METHOD TO SELECTIVELY IDENTIFY AT RISK DIE BASED ON LOCATION WITHIN THE RETICLE

BACKGROUND OF THE INVENTION

The present invention generally relates to methods and systems for identifying "at risk" die on a reticle, and more specifically relates to a method and system for selectively identifying "at risk" die based on location within the reticle which can be used for a multitude of applications including reliability improvement, and through die trace capabilities, for final test disposition and quality control at the customer side.

Patterns corresponding to complex circuitry are formed on a wafer using photolithography. This involves first generating a reticle which is a transparent silica (quartz) plate containing the pattern. Opaque regions on the plate are formed of an ultraviolet light-absorbing layer, such as iron oxide. The pattern is usually created by an electron beam which is controlled by a computer running pattern generation software. Once the pattern is created using the electron beam, the pattern on the reticle is developed in a chemical solution. Once the reticle is formed, it can be used repeatedly to pattern silicon wafers. To make a typical integrated circuit, more than a dozen reticles are typically required, corresponding to different process steps.

It is not uncommon for certain locations on a reticle to be defective, i.e. print repeated defects. In such case, the defect may not always result in a failing die. However, the passing die in that reticle location will be at risk of failing in the field (such as where there is partial bridging on a passing die, in which case the die will be at risk of failing in the field due to heating, shock, etc.). Hence, good die in "at risk" reticle locations are likely to be reliability risks.

As shown in FIG. 1, generally current practice in the industry provides that when an "at risk" pattern is identified during engineering review, the lots are put on hold, and the wafer maps are altered manually. This method may be called "Manual Repeater Downgrading" due to the fact that the method requires manual intervention for identification and rectification. Problems with the method include the fact that it is a manual process, and the fact that there is a risk of overlooking potential problems.

BRIEF SUMMARY OF THE INVENTION

An object of an embodiment of the present invention is to provide a method and system for selectively identifying "at risk" die based on location within the reticle.

Another object of an embodiment of the present invention is to provide a method and system which enables automated capture of "at risk" die at wafer sort based on differences in yield across the reticle field.

Still another object of an embodiment of the present invention is to provide a method and system for selectively identifying "at risk" die, where the method and system are generally more automated and reliable than that which is currently widely used in the industry (i.e., observing and identifying an "at risk" pattern through engineering review, putting the lots on hold, and manually altering the wafer maps).

Briefly, and in accordance with at least one of the foregoing objects, an embodiment of the present invention provides a method of selectively identifying "at risk" die based on location within the reticle, where the method includes storing reticle and stepping information in a database, overlaying all reticle shots in a wafer and in a lot on top of each other, using the reticle and stepping information to calculate yield of reticle fields, determining if the yield of some reticle locations is below a statistical measure by a predetermined threshold, and if so, downgrading all the die in that location.

The statistic measure to which the yield of the reticle locations is compared may be, for example, median yield or average yield, but any appropriate statistic measure can be used. The statistical value need not be based on the reticle alone, and instead, can be a wafer or lot level statistic. Also, the overall process can be applied at a lot or wafer level or both.

Another embodiment of the present invention may provide a system which can be used to selectively identify "at risk" die based on location within the reticle, where the system includes a bin reticle and stepping information database, code configured to compute reticle field yield for a specific die bin (representing a specific failure mode) and a statistical measure, code configured to determine if the yield of some reticle locations is below the statistical measure by a pre-determined threshold, and code configured to downgrade "at risk" die (i.e., if it is determined that the yield of some reticle locations is below the statistical measure by a pre-determined threshold).

BRIEF DESCRIPTION OF SEVERAL VIEWS OF THE DRAWINGS

The organization and manner of the structure and operation of the invention, together with further objects and advantages thereof, may best be understood by reference to the following description, taken in connection with the accompanying drawing, wherein:

FIG. 4 is a diagram which shows an exemplary overlay map of all wafers in a lot, wherein the sizes of the white squares are proportional to the yields at the respective locations;

FIG. 5 is a diagram which shows an exemplary overlay map of all the reticle shots along with the yield of each location;

FIG. 6 is a chart which illustrates when dies in a field are candidates for downgrading.

DETAILED DESCRIPTION OF THE INVENTION

Figure 1:
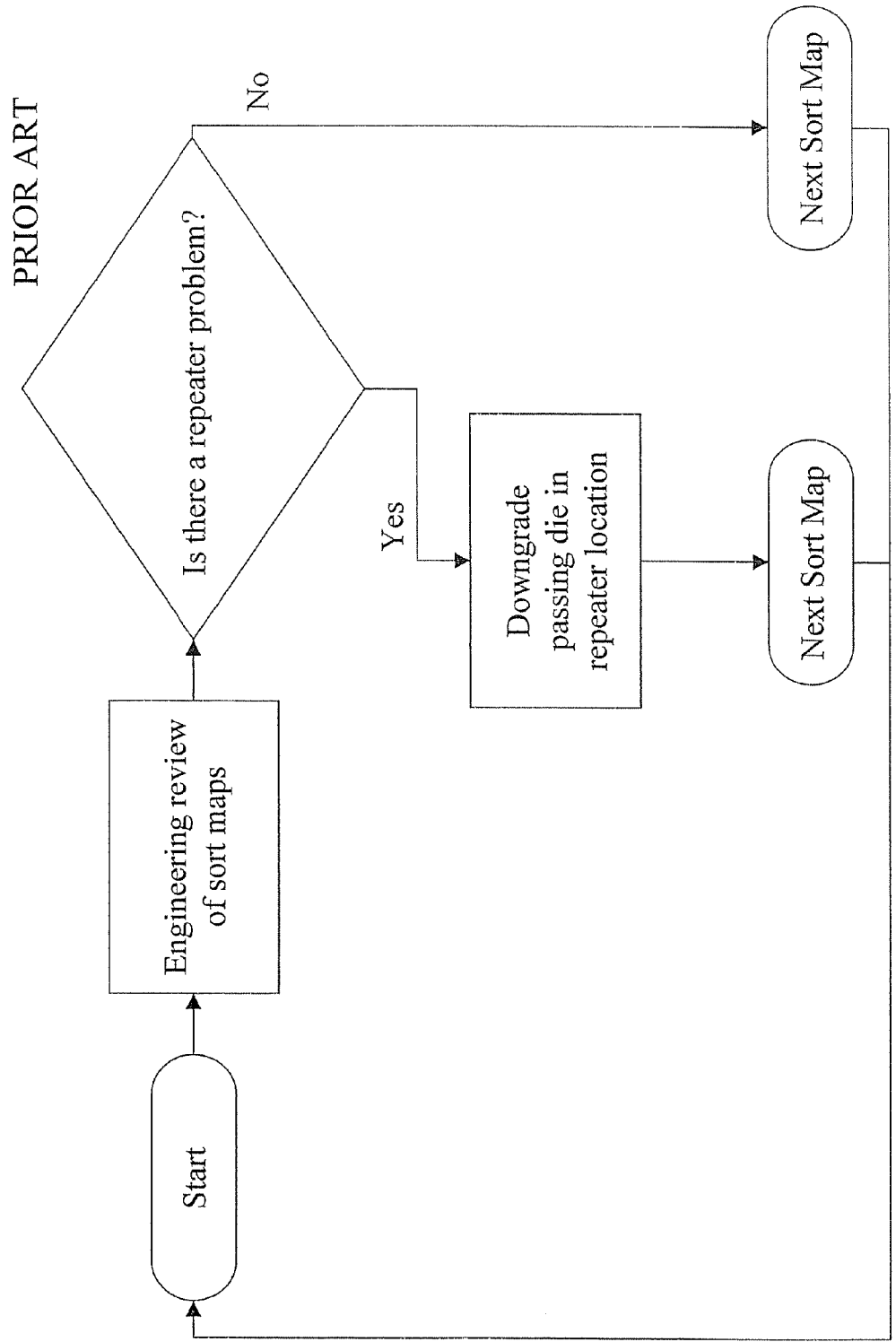
FIG. 1 is a flow chart which illustrates a prior art method of identifying and rectifying "at risk" die.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
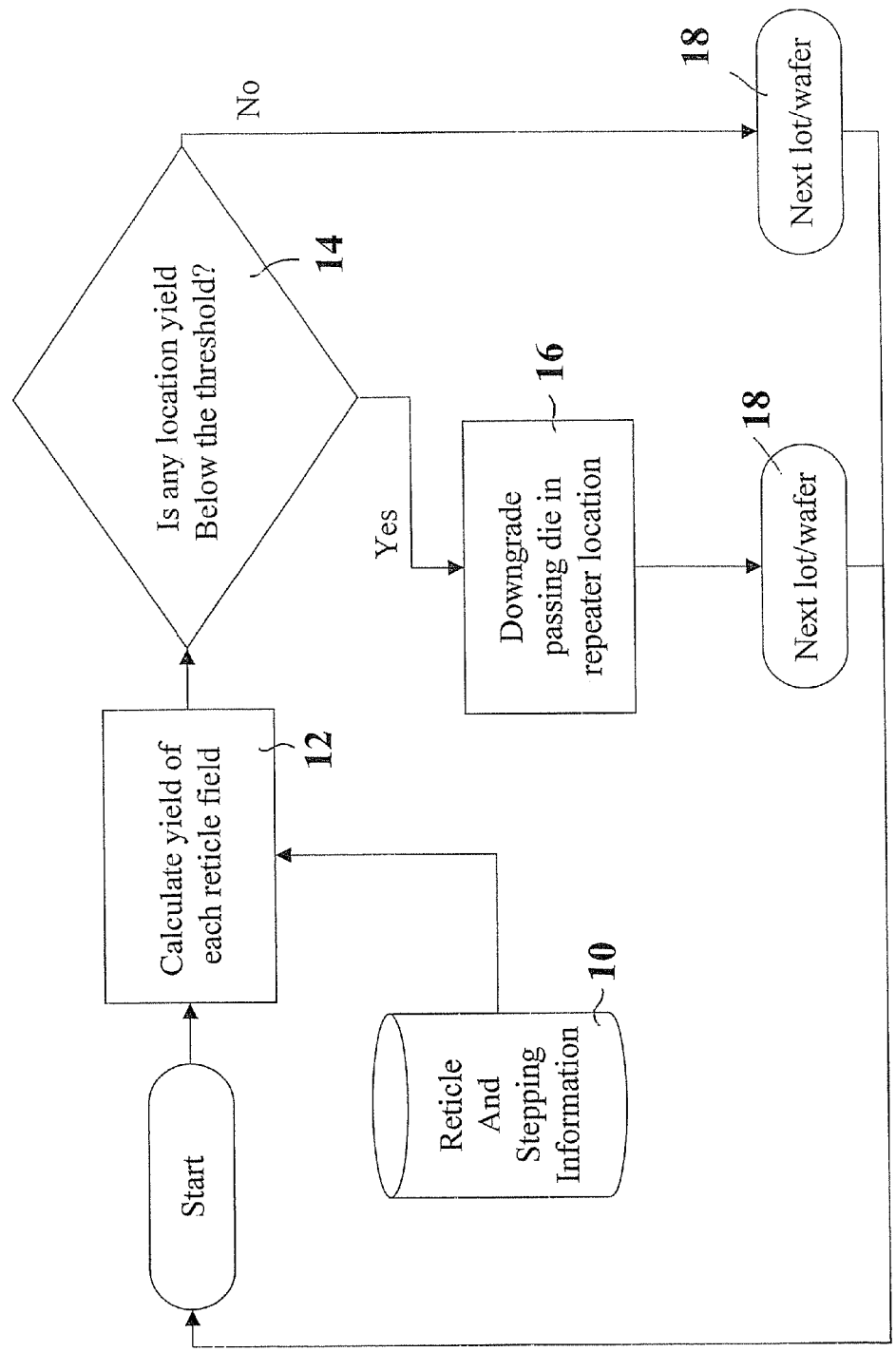
FIG. 2 is a flow chart similar to FIG. 1, but where the method is in accordance with an embodiment of the present invention.
Figure 3:
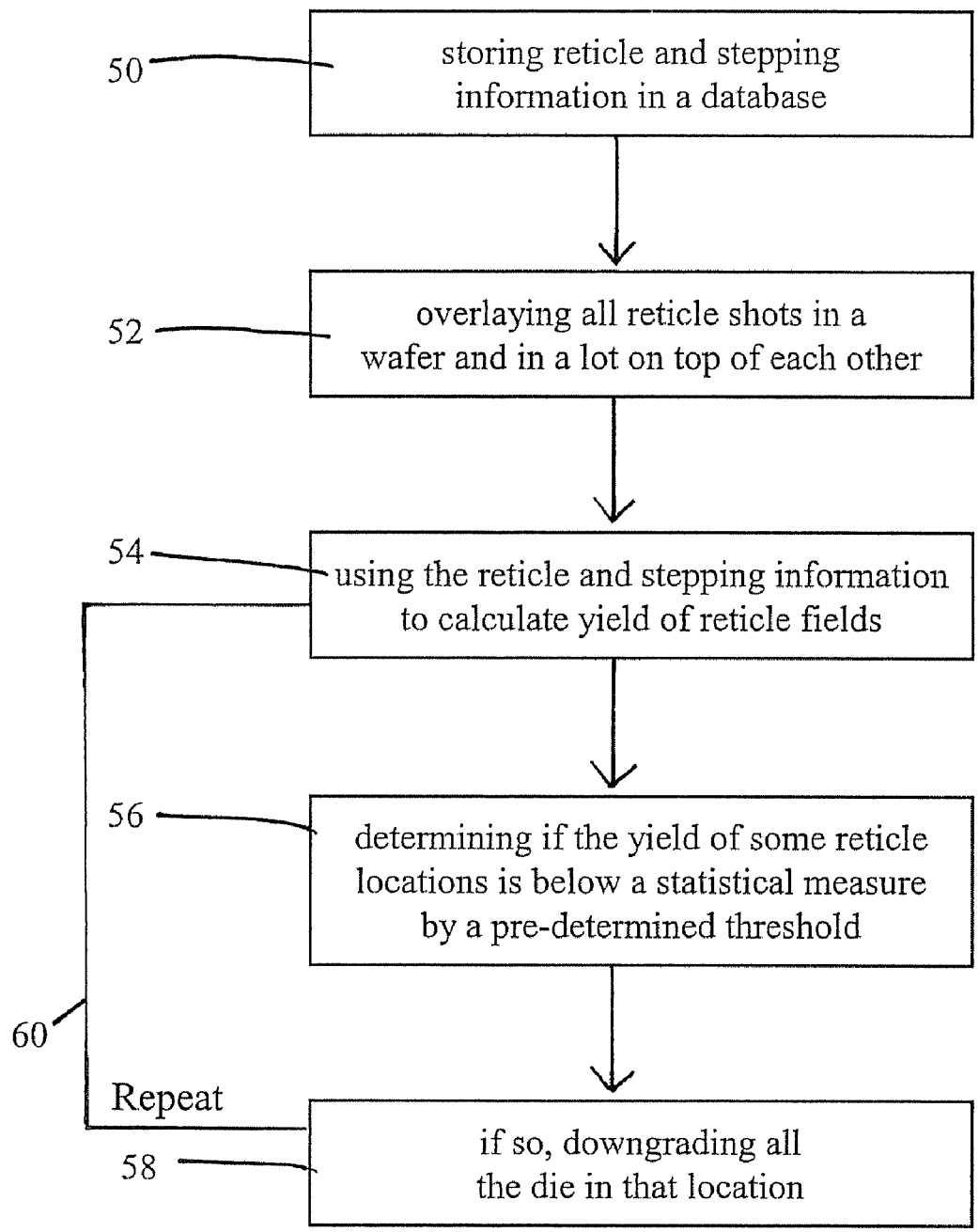
FIG. 3 is a block diagram showing the steps of the method of FIG. 2 in more detail.

FIG. 2 illustrates a method for selectively identifying at risk die, where the method is in accordance with an embodiment of the present invention. FIG. 3 shows the steps of the method in more detail. The method may be called "Automated Repeater Downgrading" since there is no manual intervention required for identification and rectification. The method enables automated capture of "at risk" die at wafer sort based on differences in yield across the reticle field. The method is generally more automated and reliable than that which is currently widely used in the industry (i.e., observing and identifying an "at risk" pattern through engineering review, putting the lots on hold, and manually altering the wafer maps).

As shown in FIGS. 2 and 3, the method includes the following steps: storing reticle and stepping information in a database (box 10 in FIG. 2 and box 50 in FIG. 3), overlaying all reticle shots in a wafer and in a lot on top of each other (box 52 in FIG. 3 (see also box 12 of FIG. 2)), using the reticle and stepping information to calculate yield of reticle fields (box 12 in FIG. 2 and box 54 in FIG. 3), determining if the yield of some reticle locations is below a statistical measure by a pre-determined threshold (box 14 in FIG. 2 and box 56 in FIG. 3), and if so, downgrading all the die in that location (box 16 in FIG. 2 and box 58 in FIG. 3), and repeating the process for the rest of the reticle (boxes 18 in FIG. 2 and line 60 in FIG. 3).

The statistic measure to which the yield of the reticle locations is compared may be, for example, median yield or average yield, but any appropriate statistic measure can be used. The statistical value need not be based on the reticle alone, and instead, can be a wafer or lot level statistic. Also, the overall process can be applied at a lot or wafer level or both.

FIG. 4 shows an exemplary overlay map of all wafers in a lot, wherein the sizes of the white squares are proportional to the yields at the respective locations. FIG. 5 is an exemplary overlay map of all the reticle shots along with the yield of each location, and FIG. 6 is a chart which illustrates when dies in a field are candidates for downgrading.

Figure 7:
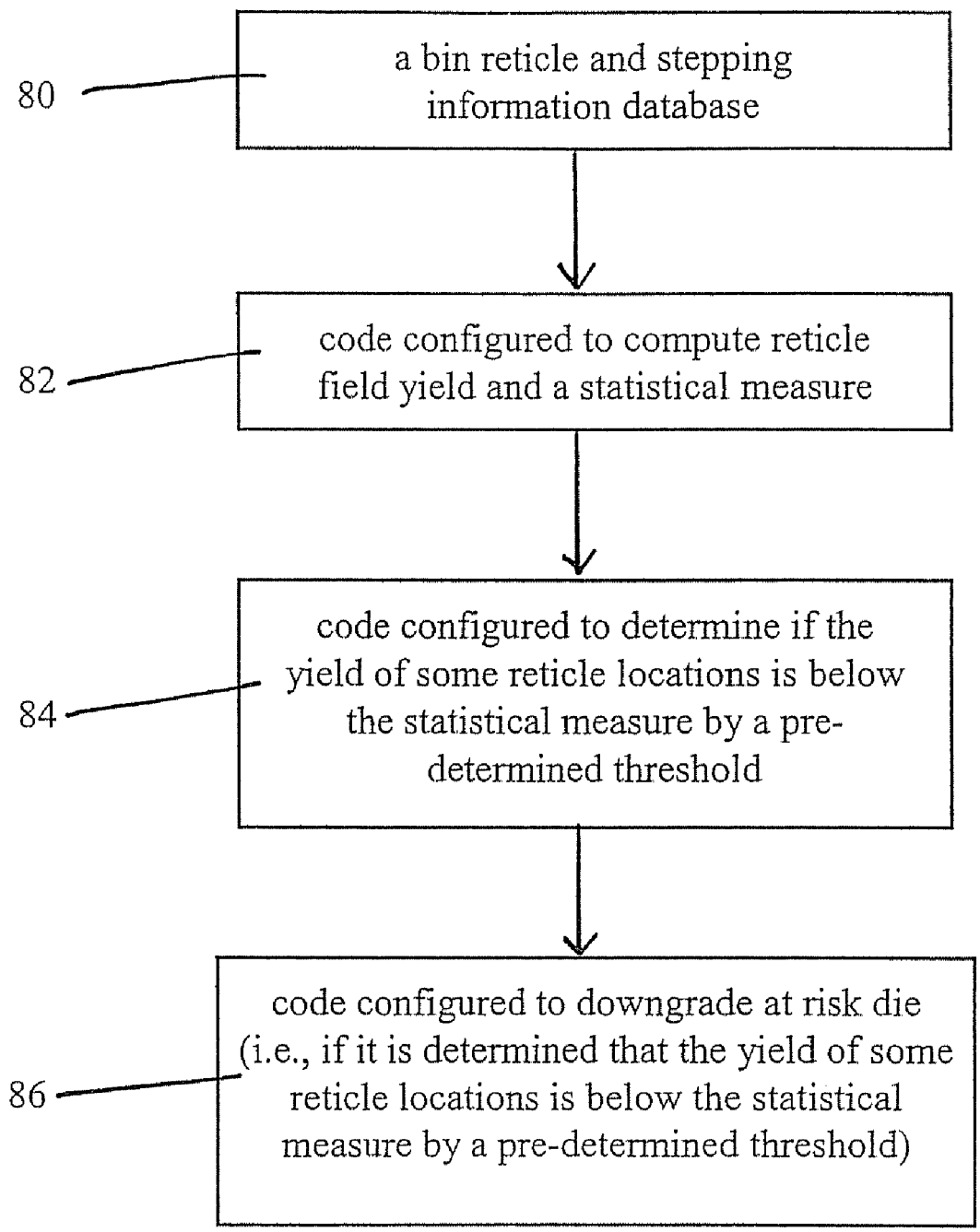
FIG. 7 is a block diagram which illustrates a system which can be used to practice the method illustrated in FIGS. 2 and 3.

FIG. 7 is a block diagram which illustrates a system which can be used to practice the method illustrated in FIGS. 2 and 3. As shown, the system includes a bin reticle and stepping information database (box 80 in FIG. 7), code configured to compute reticle field yield and a statistical measure (box 82 in FIG. 7), code configured to determine if the yield of some reticle locations is below the statistical measure by a pre-determined threshold (box 84 in FIG. 7), and code configured to downgrade at risk die (box 86 in FIG. 7) (i.e., if it is determined that the yield of some reticle locations is below the statistical measure by a pre-determined threshold). As discussed above, the statistic measure to which the yield of the reticle locations is compared may be, for example, median yield or average yield, but any appropriate statistic measure can be used. The statistical value need not be based on the reticle alone, and instead, can be a wafer or lot level statistic. The system may be configured such that the overall process is applied at a lot or wafer level or both.

The system and method in accordance with the present invention does not require manual intervention required for identification and rectification of at risk die. Instead, the method and system enable automated capture of "at risk" die at wafer sort based on differences in yield across the reticle field. Furthermore, the method and system are generally more automated and reliable than that which is currently widely used in the industry (i.e., observing and identifying an "at risk" pattern through engineering review, putting the lots on hold, and manually altering the wafer maps).

While embodiments of the present invention are shown and described, it is envisioned that those skilled in the art may devise various modifications of the present invention without departing from the spirit and scope of the appended claims.

What is claimed is:

1. A method of selectively identifying at risk die based on location within a reticle, said method comprising: storing reticle and stepping information in a single database; after storing reticle and stepping information in the single database, overlaying reticle shots on top of each other; after storing reticle and stepping information in the single database and after overlaying reticle shots on top of each other, using the reticle and stepping information in the single database to calculate yield of reticle fields; determining if the calculated yield of some reticle locations is below a statistical measure by a pre-determined threshold; and if so, downgrading die in that location.

2. A method as recited in claim 1, wherein said step of overlaying reticle shots comprises overlaying all reticle shots in a wafer and in a lot on top of each other.

3. A method as recited in claim 1, wherein said step of determining if the yield of some reticle locations is below a statistical measure by a pre-determined threshold comprises determining if the calculated yield of some reticle locations is below a median yield.

4. A method as recited in claim 1, wherein said step of determining if the calculated yield of some reticle locations is below a statistical measure by a pre-determined threshold comprises determining if the calculated yield of some reticle locations is below an average yield.

5. A method as recited in claim 1, further comprising calculating the statistical measure.

6. A method as recited in claim 1, further comprising calculating median yield.

7. A method as recited in claim 1, further comprising calculating average yield.

8. A method as recited in claim 1, further comprising performing the method at a lot level.

9. A method as recited in claim 1, further comprising performing the method at a wafer level.

10. A method as recited in claim 1, further comprising performing the method at a lot level and at a wafer level.

11. A system configured for selectively identifying at risk die based on location within a reticle, said system comprising: a single bin reticle and stepping information database; code configured to use the single database to compute reticle field yield for a specific die bin (representing a specific failure mode) and a statistical measure; code configured to determine if the computed yield of some reticle locations is below the statistical measure by a pre-determined threshold; and code configured to downgrade at risk die if it is determined that the computed yield of some reticle locations is below the statistical measure by the pre-determined threshold.

12. A system as recited in claim 11, wherein said code configured to determine if the computed yield of some reticle locations is below a statistical measure by a pre-determined threshold comprises code configured to determine if the computed yield of some reticle locations is below a median yield.

13. A system as recited in claim 11, wherein said code configured to determine if the computed yield of some reticle locations is below a statistical measure by a pre-determined threshold comprises code configured to determine if the computed yield of some reticle locations is below an average yield.

14. A system as recited in claim 11, wherein said system is configured to selectively identify at risk die at a lot level.

15. A system as recited in claim 11, wherein said system is configured to selectively identify at risk die at a wafer level.

16. A system as recited in claim 11, wherein said system is configured to selectively identify at risk die at a lot level and at a wafer level.

* * * * *